United States Patent
Stahl

[11] Patent Number: 6,005,692
[45] Date of Patent: Dec. 21, 1999

[54] LIGHT-EMITTING DIODE CONSTRUCTIONS

[76] Inventor: Thomas D. Stahl, 45 Nora Way, Atherton, Calif. 94027

[21] Appl. No.: 09/087,003

[22] Filed: May 29, 1998

Related U.S. Application Data

[60] Provisional application No. 60/050,421, May 29, 1997.

[51] Int. Cl.⁶ .................. G02B 5/32; H01L 33/00
[52] U.S. Cl. .................. 359/15; 359/34; 385/37; 257/40; 257/89; 257/98
[58] Field of Search .................. 257/40, 89, 98; 385/37; 359/15, 34

[56] References Cited

U.S. PATENT DOCUMENTS

| | | | |
|---|---|---|---|
| H840 | 11/1990 | Efron et al. | 350/320 |
| 3,976,361 | 8/1976 | Fraas et al. | 350/160 LC |
| 4,032,954 | 6/1977 | Grinberg et al. | 357/30 |
| 4,124,278 | 11/1978 | Grinberg et al. | 350/342 |
| 4,127,322 | 11/1978 | Jacobson et al. | 353/31 |
| 4,191,456 | 3/1980 | Hong et al. | 353/31 |
| 4,343,535 | 8/1982 | Bleha, Jr. | 350/342 |
| 4,344,668 | 8/1982 | Gunther et al. | 350/96.27 |
| 4,349,817 | 9/1982 | Hoffman et al. | 340/784 |
| 4,425,028 | 1/1984 | Gagnon et al. | 350/337 |
| 4,461,542 | 7/1984 | Gagnon | 350/331 R |
| 4,464,018 | 8/1984 | Gagnon | 350/331 R |
| 4,464,019 | 8/1984 | Gagnon | 350/331 R |
| 4,500,172 | 2/1985 | Gagnon et al. | 350/331 R |
| 4,544,237 | 10/1985 | Gagnon | 350/331 R |
| 4,650,286 | 3/1987 | Koda et al. | 350/331 R |
| 4,679,910 | 7/1987 | Efron et al. | 350/335 |
| 4,715,684 | 12/1987 | Gagnon | 350/331 R |
| 4,728,174 | 3/1988 | Grinberg et al. | 350/334 |
| 4,799,765 | 1/1989 | Ferrer | 350/174 |
| 4,807,976 | 2/1989 | Little et al. | 350/355 |
| 4,807,978 | 2/1989 | Grinberg et al. | 350/3.73 |
| 4,826,293 | 5/1989 | Grinberg et al. | 350/331 R |
| 4,828,368 | 5/1989 | Efron et al. | 350/355 |
| 4,894,724 | 1/1990 | Welkowsky | 358/231 |
| 4,917,472 | 4/1990 | Margerum et al. | 350/340 |
| 4,973,136 | 11/1990 | Braatz | 350/338 |
| 5,210,628 | 5/1993 | Shields et al. | 359/72 |
| 5,229,872 | 7/1993 | Mumola | 359/40 |
| 5,245,451 | 9/1993 | Wu et al. | 359/55 |
| 5,283,676 | 2/1994 | Borah et al. | 359/67 |
| 5,335,300 | 8/1994 | Hartman et al. | 385/37 |
| 5,384,650 | 1/1995 | TeKolste et al. | 359/77 |
| 5,398,082 | 3/1995 | Henderson et al. | 348/781 |
| 5,428,467 | 6/1995 | Schmidt | 359/40 |
| 5,469,518 | 11/1995 | Song et al. | 385/89 |
| 5,502,785 | 3/1996 | Wang et al. | 385/92 |
| 5,513,021 | 4/1996 | Kaneshiro et al. | 359/15 |
| 5,570,213 | 10/1996 | Ruiz et al. | 359/72 |
| 5,608,833 | 3/1997 | Au et al. | 385/116 |
| 5,621,551 | 4/1997 | Henderson et al. | 349/7 |
| 5,631,994 | 5/1997 | Appeldorn et al. | 385/147 |
| 5,680,231 | 10/1997 | Grinberg et al. | 359/15 |
| 5,682,255 | 10/1997 | Friesem et al. | 359/15 |
| 5,745,266 | 4/1998 | Smith | 359/34 |

*Primary Examiner*—Jerome Jackson, Jr.
*Assistant Examiner*—Bradley William Baumeister
*Attorney, Agent, or Firm*—Harness, Dickey & Pierce, P.L.C.

[57] ABSTRACT

A light-emitting assembly defining a pixel comprising a series of red, green, and blue light-emitting segments in general alignment and connected by first and second electrodes. The light-emitting segments are built upon a fiber optic core. According to the preferred embodiment, the core is coated with a holographic interface material.

20 Claims, 2 Drawing Sheets

Fig-4
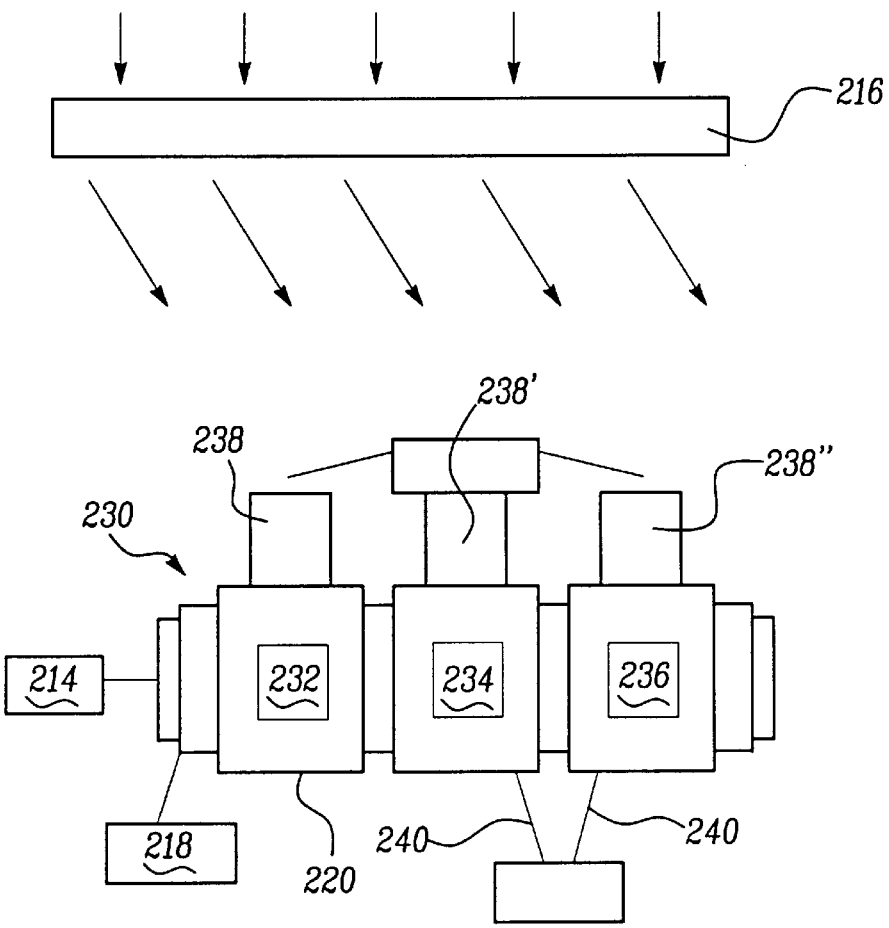
Fig-5
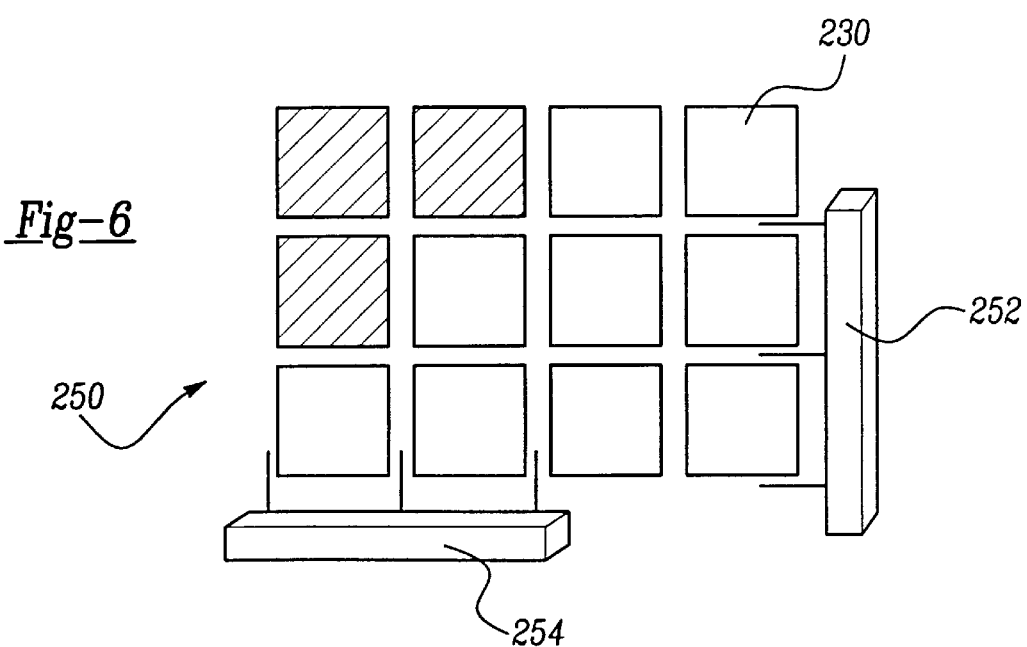
Fig-6

LIGHT-EMITTING DIODE CONSTRUCTIONS

This application claims benefit of Provisional Appln. 60/050,421 filed May 29, 1997.

BACKGROUND OF THE INVENTION

1. Field of the Invention

The present invention relates to light-emitting diode constructions.

2. Description of the Prior Art

Related to the problem of distorted video projections are the fundamental problems inherent in of pixel and light-emitting diode construction, particularly in the construction of large area flat panel displays. Light-emitting diodes (or "LEDs") are semiconductor devices designed to convert an incoming flow of electric energy into an outgoing flow of electromagnetic radiation having wavelengths of between about 550 nanometers (green color) to about 1300 nanometers (infrared). Known LEDs are limited to emitting a specific color such that a diode might emit, for example, a red color and a neighboring diode might emit, again for example, a green color.

Diodes today are formed from materials including gallium, indium, aluminum, arsenic, and phosphorus. The individual diode is built up upon a gallium arsenide single-crystal substrate. As is known, an n-type layer of vapor-deposited gallium arsenide phosphate is formed over the single-crystal substrate, followed thereafter by a p-type layer, also formed by vapor-deposition. Ohmic contacts are formed on both sides of the LED.

A major difficulty of known LEDs is a result of the fact that very little of the light energy produced by the diode can, in fact, escape the diode and, as a consequence, only a few percent of the consumed electrical input results in externally observable light. Compounding this problem is the extraction of the radiation into an optical fiber. This is so because the optical fiber has a relatively narrow light acceptance angle of between about 10 and 15 percent. To improve light transmission between the LED and an optical fiber, the construction of LEDs is modified such that a well is formed in one side of the substrate and one end of the optical fiber is positioned in the well. Other modifications are made to the LED to improve light transmission into the optical fiber, such as the deposition of additional layers of material upon the substrate. However, the loss of light energy between the LED and the output end of the optical fiber is still of considerable consequence and presents a great limitation to the versatility of known LEDs.

An additional difficulty of known LEDs is the redundancy and multiplicity of transistors driving each of the pixel pads which comprise the individual LEDs. Because each known LED requires its own power source, there is extensive and expensive use of the transistors.

In general, the present invention provides improved displays through fiber construction, a holographic interface, the use of plastic LED light emitters, semi-conductor manufacturing tools, and the incorporation of automated final assembly.

SUMMARY OF THE PRESENT INVENTION

The present invention provides a reflecting image plane which overcomes the above-mentioned disadvantages.

The present invention provides an improvement over known pixel and LED construction by providing a single assembly which incorporates into a single pixel (either horizontally or vertically) red, green, and blue emitters. According to the construction of the present invention, the red emitter picks up the red dichroic, the green emitter picks up the green dichroic, and the blue emitter picks up the blue dichroic. By building up the wafer in each of the pixels such that the wafer arrangement is identical in each strip, the individual pixels can then be lined up to produce the display. This arrangement eliminates the need for multiple transistors. In addition, the present invention relies upon the red, green, and blue LEDs coating a holographic interface layer to produce an optically conductive element. This holographic interface layer causes the light produced by the LED to enter the optical fiber at an angle sufficient to allow it to continue conducting the light to the end of the fiber where it exists as mixed (multicolored) light. Accordingly, the LED construction and pixel arrangement of the present invention overcomes many of the known problems of the prior art.

BRIEF DESCRIPTION OF THE DRAWINGS

A better understanding of the present invention will be had upon reference to the following detailed description when read in conjunction with the accompanying drawings in which like reference characters refer to like parts throughout the several views, and in which:

FIG. 4 is a view illustrating the holographic effect produced according to the arrangement of the present invention;

FIG. 5 is a view illustrating the elements of a single pixel of the present invention; and FIG. 6 is a view showing the display assembly according to the present invention.

DETAILED DESCRIPTION OF THE PREFERRED EMBODIMENT OF THE PRESENT INVENTION

The drawings disclose the preferred embodiments of the present invention. While the configurations according to the illustrated embodiments are preferred, it is envisioned that alternate configurations of the present invention may be adopted without deviating from the invention as portrayed. The preferred embodiments are discussed hereafter.

According to the present invention, improved pixel and LED construction is provided as set forth in FIGS. 1 through 6. These figures generally disclose a three-dimensional fiber optic bundled polymer LED display system according to the present invention.

The present invention is related to the functioning of semiconductor coated fibers as a diode switch. The system of the present invention uses red, green, and blue LEDs coated with a holographic interface layer to produce an optically conductive element. The holographic interface causes the light produced by the polymer LED material to enter the fiber at an angle sufficient to allow it to continue conducting to the end of the fiber where it exits as mixed light.

The pixel arrangement of the present invention is formed using the third dimension. The pixel so formed overcomes the problems of large area displays with high resolution. The equation Tau=RC defines the relationship between the resistance and capacitance of the display row and column electrode dimensions known as the RC time constant. By using the third dimension, limitations of this type are avoided. If it is necessary to increase the row or column dimension to maintain the RC time constant, the display is manufactured deeper to increase the necessary dimensions of the row and column electrode which overcomes this problem. The electrodes themselves can be formed out of any number of conducting materials which may be either transparent or opaque.

Figure 1:
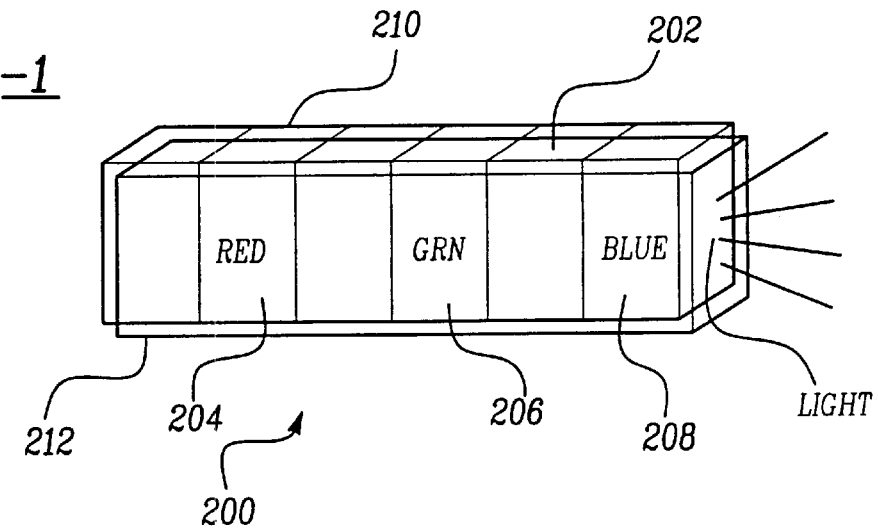
FIG. 1 is a perspective view of the internal components of a single pixel according to the present invention.

FIG. 1 illustrates a multi-color pixel according to the present invention, generally illustrated as 200. The pixel 200 includes a body 202 that is composed of a red light-emitting segment 204, a green light-emitting segment 206, and a blue light-emitting segment 208. Each of the segments 204, 206, 208 is generally aligned with the other segment. A Y-electrode 210 is provided along one axis of the pixel 200 and an X-electrode 212 is provided along the other axis of the pixel 200. The electrodes are connected to the pixel element. The pixel element is preferably composed of a glass or plastic fiber. The structure is that of some type of transparent rod in any number of geometric shapes including round, square, or hexagonal. The dimensions of these pixel elements is a function of the display resolution. For course displays, the pixel elements are relatively large, whereas they may be very small for high definition information content displays. The pixel element structure is a critical substrate on which the light bending and light transmitting materials are deposited.

While the preferred embodiment of the present invention utilizes light-emitting diodes as the preferred light-emitting element, other light-emitting materials may be utilized. For example, a light-emitting polymer device or polymer LEDs might be alternatively selected. Interest in this light-emitting arrangement began with the discovery of light-emission from the conjugated polymer poly(p-phenylene vinylene). Emission colors from light-emitting polymers range from deep blue to near infrared. These devices have also demonstrated high internal quantum efficiencies, high resolution, fast switching, and low voltage operations.

The typical light-emitting polymer device incorporates a polymer substrate (which may be thin sheets of glass, plastic, or metal) coated with a transparent electrode. Over the electrode is disposed a layer of PPV, and over the PPV layer is formed a layer of CN-PPV. Top electrodes are positioned on the CN-PPV layer.

Figure 2:
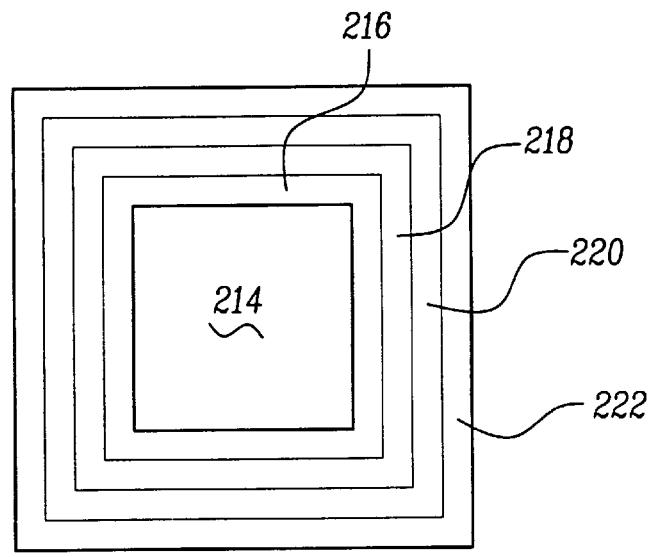
FIG. 2 is an end view of a pixel structure according to the present invention.

FIG. 2 illustrates an end view of the pixel 200 of FIG. 1. The pixel structure is built up from a fiber core 214 which comprises a raw fiber about 4.0 $\mu$m to 300.0 $\mu$m (and larger depending on the size of the display being manufactured). The core fibers 214 are coated with a holographic interface 216 composed of a dichromated gel-type of material that acts as a holographic film substrate onto which a specific pattern can be developed similar to film. The holographic pattern causes any light striking it to be bent to a predefined angle of reception when attenuated to the end of the exit surface of the particular fiber. Snell's law applies for the internal reflection prior to the light exiting the fibers.

A number of optical thin films are potentially useful in providing the desired holographic film substrate. These films are selected from the general groups of oxides, fluorides, and infrared materials. Oxide-based films may be selected from the group consisting of aluminum oxide, chromium oxide, hafnium oxide, indium oxide, indium-tin oxide, neodymium oxide, praseodymium oxide, scandium oxide, silicon dioxide, silicon monoxide, tantalum pentoxide, titanium dioxide, yttrium oxide, and zirconium dioxide. Fluoride-based films may be selected from the group consisting of aluminum fluoride, calcium fluoride, cerium fluoride, cryolite, lanthanum fluoride, magnesium fluoride, thorium fluoride, and yttrium fluoride. Infrared material-based thin film materials may be selected from the group consisting of zinc selenide, zinc sulfide, cadmium telluride, and lead telluride.

The light bending material may also be selected from the group consisting of surface deformable c-Si, LCD c-Si, LCD x-Si thin film to glass transfer, LCD high temperature p-Si on quartz, emissive c-Si on an insulator, and emissive c-Si. Display processes are also known and are available by the following manufacturers under the following names: Silicon Light Machines GLV, Hertz Institute DM, Texas Instruments DMD, Displaytech FLC, Spatialight c-Si LCD, MicroDisplay c-SI LCD, Kopin x-Si LCD, Seiko-Epson p-Si LCD, Raychem Hitachi PDLC, Planar Systems AMEL, and Micron Technology FED.

Over the holographic interface 216 is formed a conducting transparent electrode layer 218 which is indium tin oxide (ITO) or is comparable to ITO. The layer 218 acts as the base electrode for the LED structure and data row for the drive electronics.

Over the conducting electrode layer 218 is deposited a single layer 220 of polymer LED material. The structure of the pixel 200 is completed by a final coating of metal 222 which acts as the data electrode and capacitive plate for the LED.

With respect to the holographic interface 216, it should be understood that there are a number of optical coatings that modify light in some form. The preferred coating produces the desired result of functioning as a holographic element which has the effect of causing the light to bend at the desired angle to initiate its path down the internal reflecting surfaces of the pixel element and to exit by design out of the end of the pixel element. It should be understood that while the holographic layer is the preferred structure, other light-bending coatings may be used. It may also be the case that surface relief elements may also act in a similar way. These are known as "surface holograms" that are produced by structure and not by coating. The effect is substantially the same as the designed pattern causes the light to bend at a predefined angle to the incident light passing through the surface.

Figure 3:
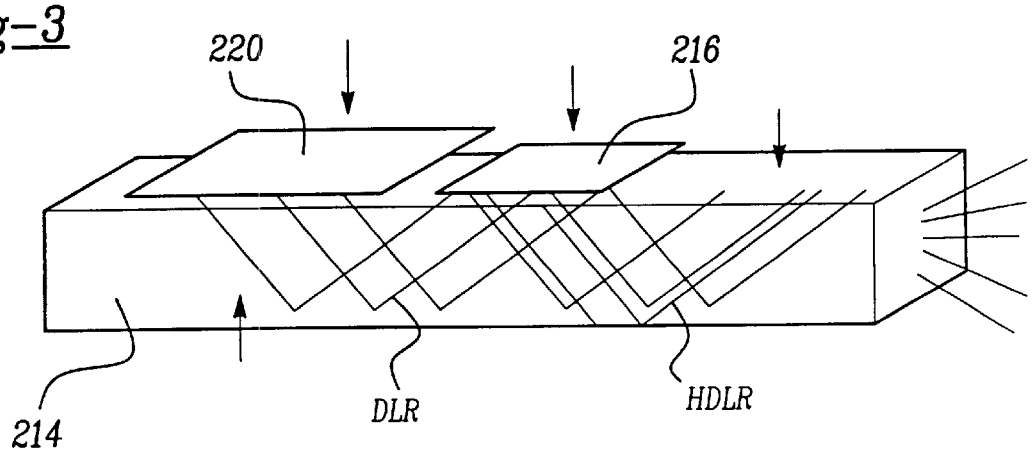
FIG. 3 is a perspective view of the holographic interface of the present invention.

FIG. 3 illustrates a perspective view of the holographic interface 216 according to the present invention. The fiber core 214 is shown having a portion of the holographic interface 216 positioned in approximate relation thereto. In addition, a portion of the plastic LED 220 is also positioned in approximate relation thereto. FIG. 3 shows exemplary directed light rays marked "DLR". These are directed light rays which are internal to the fiber 214. FIG. 3 also shows exemplary holographic directed light rays marked "HDLR".

The effect of the presence of the holographic interface 216 is shown in FIG. 4 in which a portion of the holographic interface 216 is illustrated. As shown, passing light is bent to a pre-specified angle.

FIG. 5 illustrates an arrangement of a pixel according to the present invention. The pixel, generally illustrated as 230, comprises a red LED coating 232, a green LED coating 234, and a blue LED coating 236. The pixel 230 includes a plurality of column electrodes 238, 238', 238" which are connected respectively to the red LED coating 232, the green LED coating 234, and the blue LED coating 236. A series of row electrodes 240 are also provided to provide energy to the pixel 230. The bare or raw fiber 214 is provided internally to the pixel 230. The ITO coating 218 is formed between the fiber 214 and the plastic LED layer 220.

By building separate red, green, and blue fiber pixels, a complete color display can be built. Additionally, if the red-green-blue color LED structure is built according to the arrangement of FIG. 5, a complete color display can be assembled in which the required number of optical fibers from the red-green-blue individual pattern may be reduced by 66 percent. According to this arrangement, each individual pixel can illuminate the entire color spectrum including the grey scale.

The pixels of the present invention are provided in a display, generally illustrated as 250, shown in FIG. 6. The individual pixels 230 are positioned in rows and columns. Each of the individual rows of pixels 230 is powered by a row driver 252, while each of the individual columns of pixels 230 is powered by a column driver 254. A binder or glue is provided between the individual pixels 230 to form the display 250.

The display is driven in a manner similar to known passive displays. The row and column technique charges each color area to a level predefined as the voltage/current curve versus brightness at the end area of each pixel where the photons escape to be detected by the eye, and with a high concentration of pixels bundled together to produce an image comparable to that of traditional CRT or television technology. According to one variation of the present invention, light emanates from some material which releases photons when voltage is applied. This is similar to but not the same as passive display construction. Passive displays use phosphorous materials, electroluminescent materials, or one of several new plastic LED materials. Because of the low voltage of the plastic LED material, this would naturally be the material of choice. However, it is to be understood that virtually any light-emitting material could be used to generate the required photons needed by the pixel element. The present invention assumes the use of materials which produce either monochrome or color formats with a grey scale. Furthermore, the present invention includes light emitting components which are capable of producing variable light output based upon variations in voltage or applied current.

The present invention provides significant advantages over the prior art. For example, while the prior art is limited by the availability of manufacturing tools to produce large area displays, resolution, the RC time constant, the so-called "fill factor" as well as the need for redundant support circuits, the present invention offers an improved approach which is constructed in the third dimension, provides red-green-blue colors for each pixel, allows for grey scale colors, provides for scalable displays through "tiling", and uses standard drivers and standard manufacturing technology. These characteristics allow the possibility of producing displays to dimensions and resolutions not previously known.

From the preceding description of the preferred embodiment, it is evident that the objects of the present invention are attained. Although the invention has been described and illustrated in detail, it is to be clearly understood that the same is intended by way of illustration and example only and is not to be taken by way of limitation. The spirit and scope of the invention are to be limited only by the terms of the appended claims.

What is claimed is:

1. A light-emitting assembly comprising:
    an optically-conductive core;
    a first light-emitting element operatively associated with said core;
    a second light-emitting element operatively associated with said core;
    said first and second light-emitting elements being positioned adjacent one another on said core;
    a first electrode associated with said first and second light-emitting elements;
    a second electrode associated with said first and second light-emitting elements;
    an electrode layer being formed between said core and said first and second light-emitting elements; and
    a holographic interface formed between said core and said electrode.

2. The light-emitting assembly of claim 1, further including a third light-emitting element, said light-emitting elements emitting light in the red, green, and blue spectra.

3. The light-emitting assembly of claim 1, wherein said light-emitting elements are light-emitting diodes.

4. The light-emitting assembly of claim 1, wherein said core is a light-transmitting fiber.

5. The light-emitting assembly of claim 1, wherein said holographic interface is composed of a dichromated gel-type of material.

6. The light-emitting assembly of claim 1, further including a metal layer formed over said light-emitting elements.

7. The light-emitting assembly of claim 1, wherein said light-emitting elements are composed of a light-emitting polymer.

8. The light-emitting assembly of claim 1, wherein said first electrode is a column electrode and said second electrode is a row electrode.

9. A multi-color pixel comprising:
    a light-transmitting fiber core;
    a light-bending element operatively associated with said core;
    an electrode layer at least partially formed on said light-bending element;
    a first light-emitting element operatively associated with said electrode layer;
    a second light-emitting element operatively associated with said electrode layer;
    a third light-emitting element operatively associated with said electrode layer, said first, second, and third light-emitting elements each producing light at different wave lengths; and
    an outer metal coating formed substantially over said light-emitting elements.

10. The multi-color pixel of claim 9, wherein said different wave lengths are red, green and blue.

11. The multi-color pixel of claim 9, wherein said light-bending element is a holographic interface.

12. The multi-color pixel of claim 11, wherein said holographic interface is composed of a dichromated gel-type of material.

13. The multi-color pixel of claim 9, wherein said light-transmitting fiber core is composed of glass.

14. The multi-color pixel of claim 9, wherein said light-transmitting fiber core is composed of a polymer.

15. The multi-color pixel of claim 9, wherein said first, second and third light-emitting elements are light-emitting diodes.

16. The multi-color pixel of claim 9, wherein said first, second, and third light-emitting elements are light-emitting polymers.

17. A multi-color pixel comprising:
- a fiber optic core;
- a light-bending holographic interface formed on said core;
- a transparent electrode layer formed on said holographic interface;
- a plurality of light-emitting elements positioned on said transparent electrode layer; and
- a metal coating formed on said transparent electrode layer.

18. The multi-color pixel of claim 17, wherein said light-emitting elements product light in the red, green, and blue spectra.

19. The multi-color pixel of claim 18, wherein said light-emitting elements are light-emitting diodes.

20. The multi-color pixel of claim 18, wherein said light-emitting elements are composed of a light-emitting polymer.

* * * * *